United States Patent
Morishita et al.

(10) Patent No.: US 11,087,951 B2
(45) Date of Patent: Aug. 10, 2021

(54) SCANNING TRANSMISSION ELECTRON MICROSCOPE AND ABERRATION CORRECTION METHOD

(71) Applicant: JEOL Ltd., Tokyo (JP)

(72) Inventors: Shigeyuki Morishita, Tokyo (JP); Izuru Chiyo, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/776,153

(22) Filed: Jan. 29, 2020

(65) Prior Publication Data

US 2020/0266025 A1     Aug. 20, 2020

(30) Foreign Application Priority Data

Jan. 31, 2019   (JP) .............................. JP2019-015595

(51) Int. Cl.
*H01J 37/153*     (2006.01)
*H01J 37/22*      (2006.01)
*H01J 37/28*      (2006.01)

(52) U.S. Cl.
CPC .......... *H01J 37/153* (2013.01); *H01J 37/222* (2013.01); *H01J 37/28* (2013.01); *H01J 2237/1532* (2013.01); *H01J 2237/2802* (2013.01)

(58) Field of Classification Search
CPC .......... H01J 37/00; H01J 37/02; H01J 37/153; H01J 37/22; H01J 37/222; H01J 37/26; H01J 37/28
USPC ......................................... 250/306, 307, 311
See application file for complete search history.

(56) References Cited

U.S. PATENT DOCUMENTS

2009/0224169 A1\* 9/2009 Sawada ................. H01J 37/153
                                                    250/396 R
2017/0236684 A1\* 8/2017 Kohno .................... H01J 37/22
                                                    250/311

FOREIGN PATENT DOCUMENTS

JP          2009218079 A      9/2009

OTHER PUBLICATIONS

Office Action issued in JP2019-015595 dated Feb. 2, 2021.

\* cited by examiner

*Primary Examiner* — Jason L McCormack
(74) *Attorney, Agent, or Firm* — The Webb Law Firm

(57) ABSTRACT

In a scanning transmission electron microscope, a control unit performs: processing of calculating a first auto-correlation function that is an auto-correlation function of a first scanning transmission electron microscope image; processing of acquiring a first intensity profile along a straight line that passes through a center of the first auto-correlation function; processing of obtaining a position of an inflection point that is closest to the center of the first auto-correlation function in the first intensity profile and adopting an intensity at the position as a first reference intensity; processing of obtaining an aberration coefficient by fitting a first aberration function to an isointensity line that connects positions where intensity is equal to the first reference intensity in the first auto-correlation function and by fitting a second aberration function to an isointensity line that connects positions where intensity is equal to a second reference intensity in a second auto-correlation function; and processing of controlling an electron optical system based on the aberration coefficient.

9 Claims, 7 Drawing Sheets

SCANNING TRANSMISSION ELECTRON MICROSCOPE AND ABERRATION CORRECTION METHOD

CROSS-REFERENCE TO RELATED APPLICATION

This application claims priority to Japanese Patent Application No. 2019-015595 filed Jan. 31, 2019, the disclosure of which is hereby incorporated by reference in its entirety.

BACKGROUND OF THE INVENTION

Field of the Invention

The present invention relates to a scanning transmission electron microscope and an aberration correction method.

Description of Related Art

Correcting an aberration that occurs in an electron optical system is extremely important in order to obtain a higher resolution with a scanning transmission electron microscope (STEM).

For example, JP-A-2009-218079 discloses an aberration correction method for automatically correcting a focus and a two-fold astigmatism (a geometrical first-order aberration). In the aberration correction method disclosed in JP-A-2009-218079, an aberration is measured using an auto-correlation function of a scanning transmission electron microscope image (hereinafter, also referred to as a "STEM image"). Specifically, in the aberration correction method disclosed in JP-A-2009-218079, an auto-correlation function with respect to each of at least two STEM images obtained by changing focus is calculated, an aberration function is fitted to an isointensity line of each auto-correlation function, and an aberration coefficient is calculated based on each obtained aberration function.

The aberration correction method disclosed in JP-A-2009-218079 is premised on the auto-correlation function of a STEM image reflecting an intensity distribution of an electron beam (a probe) on a specimen. However, for example, when performing aberration correction using a STEM image of a dumbbell structure in which two atoms are arranged side by side as seen in Si [110], a specimen structure is reflected on an auto-correlation function. Therefore, there are cases where a calculation result indicates the presence of an aberration even when there is no aberration.

As described above, with the aberration correction method disclosed in JP-A-2009-218079, there are cases where an aberration cannot be accurately corrected.

SUMMARY

According to a first aspect of the invention, there is provided a scanning transmission electron microscope including:

an electron optical system that includes an aberration corrector; and
a control unit that controls the aberration corrector,
the control unit performing:
processing of acquiring a first scanning transmission electron microscope image and a second scanning transmission electron microscope image photographed at mutually different defocus amounts;
processing of calculating a first auto-correlation function that is an auto-correlation function of the first scanning transmission electron microscope image;
processing of acquiring a first intensity profile along a straight line that passes through a center of the first auto-correlation function;
processing of obtaining a position of an inflection point that is closest to the center of the first auto-correlation function in the first intensity profile and adopting an intensity at the position as a first reference intensity;
processing of calculating a second auto-correlation function that is an auto-correlation function of the second scanning transmission electron microscope image;
processing of acquiring a second intensity profile along a straight line that passes through a center of the second auto-correlation function;
processing of obtaining a position of an inflection point that is closest to the center of the second auto-correlation function in the second intensity profile and adopting an intensity at the position as a second reference intensity;
processing of obtaining an aberration coefficient by fitting a first aberration function to an isointensity line that connects positions where intensity is equal to the first reference intensity in the first auto-correlation function and by fitting a second aberration function to an isointensity line that connects positions where intensity is equal to the second reference intensity in the second auto-correlation function; and
processing of controlling the electron optical system based on the aberration coefficient.

According to a second aspect of the invention, there is provided a scanning transmission electron microscope including:

an electron optical system that includes an aberration corrector; and
a control unit that controls the aberration corrector,
the control unit performing:
processing of acquiring a first scanning transmission electron microscope image and a second scanning transmission electron microscope image photographed at mutually different defocus amounts;
processing of calculating a first auto-correlation function that is an auto-correlation function of the first scanning transmission electron microscope image;
processing of calculating a second auto-correlation function that is an auto-correlation function of the second scanning transmission electron microscope image;
processing of obtaining a defocus amount based on a contrast of the first auto-correlation function and a contrast of the second auto-correlation function; and
processing of controlling the electron optical system based on the obtained defocus amount.

According to a third aspect of the invention, there is provided an aberration correction method of a scanning transmission electron microscope having an electron optical system that includes an aberration corrector, the aberration correction method including:

acquiring a first scanning transmission electron microscope image and a second scanning transmission electron microscope image photographed at mutually different defocus amounts;
calculating a first auto-correlation function that is an auto-correlation function of the first scanning transmission electron microscope image;
acquiring a first intensity profile along a straight line that passes through a center of the first auto-correlation function;

obtaining a position of an inflection point that is closest to the center of the first auto-correlation function in the first intensity profile and adopting an intensity at the position as a first reference intensity;

fitting a first aberration function to an isointensity line that connects positions where intensity is equal to the first reference intensity in the first auto-correlation function;

calculating a second auto-correlation function that is an auto-correlation function of the second scanning transmission electron microscope image;

acquiring a second intensity profile along a straight line that passes through a center of the second auto-correlation function;

obtaining a position of an inflection point that is closest to the center of the second auto-correlation function in the second intensity profile and adopting an intensity at the position as a second reference intensity;

fitting a second aberration function to an isointensity line that connects positions where intensity is equal to the second reference intensity in the second auto-correlation function; and controlling the electron optical system based on an aberration coefficient obtained by the fitting of the first aberration function and the fitting of the second aberration function.

According to a fourth aspect of the invention, there is provided an aberration correction method of a scanning transmission electron microscope having an electron optical system that includes an aberration corrector, the aberration correction method including:

acquiring a first scanning transmission electron microscope image and a second scanning transmission electron microscope image photographed at mutually different defocus amounts;

calculating a first auto-correlation function that is an auto-correlation function of the first scanning transmission electron microscope image;

calculating a second auto-correlation function that is an auto-correlation function of the second scanning transmission electron microscope image;

obtaining a defocus amount based on a contrast of the first auto-correlation function and a contrast of the second auto-correlation function; and controlling the electron optical system based on the obtained defocus amount.

Figure 1:
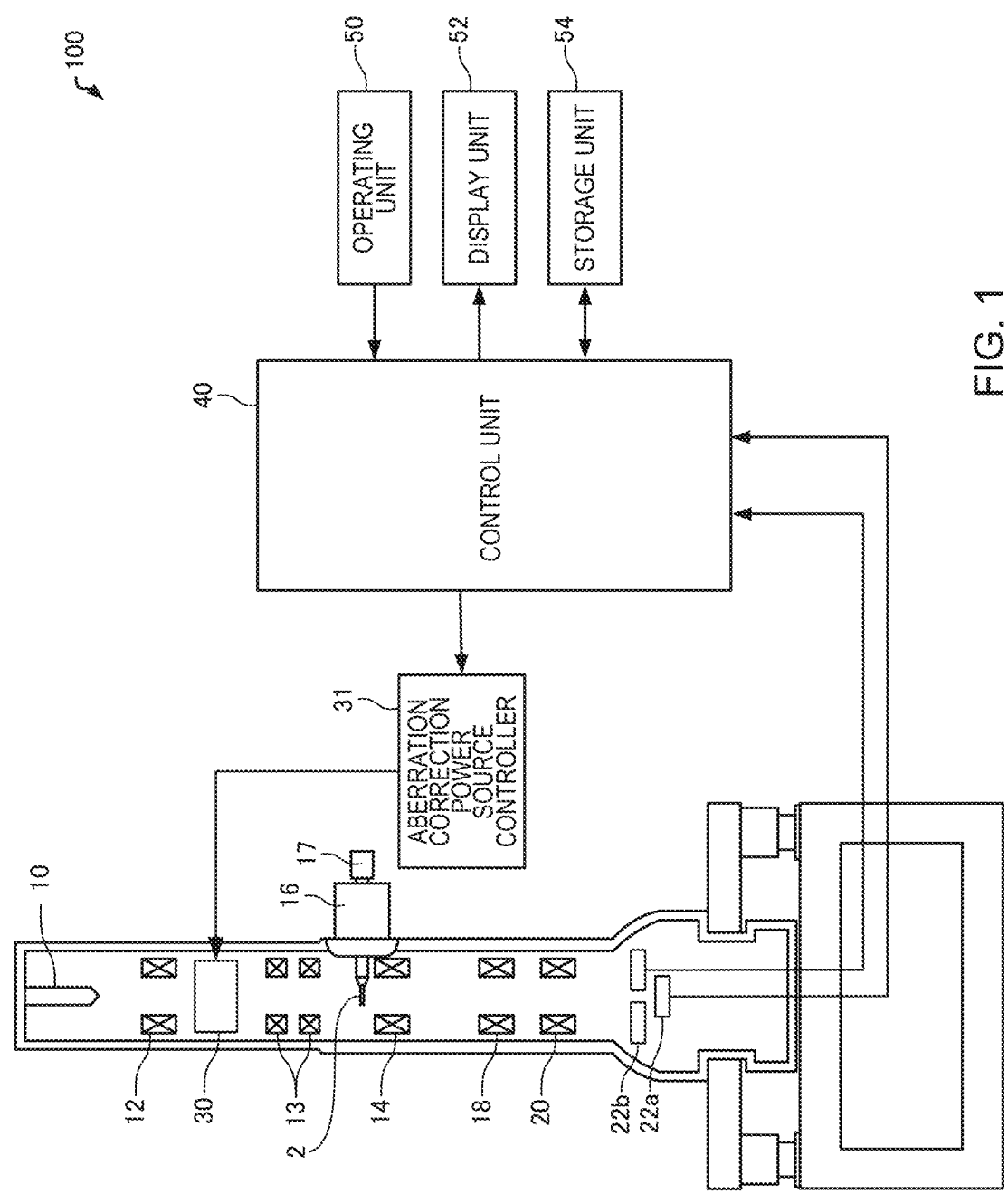
FIG. 1 is a diagram illustrating a configuration of a scanning transmission electron microscope according to an embodiment of the invention.

DETAILED DESCRIPTION OF THE EMBODIMENT (1) According to an embodiment of the invention, there is provided a scanning transmission electron microscope including:

an electron optical system that includes an aberration corrector; and a control unit that controls the aberration corrector, the control unit performing:

processing of acquiring a first scanning transmission electron microscope image and a second scanning transmission electron microscope image photographed at mutually different defocus amounts;

processing of calculating a first auto-correlation function that is an auto-correlation function of the first scanning transmission electron microscope image;

processing of acquiring a first intensity profile along a straight line that passes through a center of the first auto-correlation function;

processing of obtaining a position of an inflection point that is closest to the center of the first auto-correlation function in the first intensity profile and adopting an intensity at the position as a first reference intensity;

processing of calculating a second auto-correlation function that is an auto-correlation function of the second scanning transmission electron microscope image;

processing of acquiring a second intensity profile along a straight line that passes through a center of the second auto-correlation function;

processing of obtaining a position of an inflection point that is closest to the center of the second auto-correlation function in the second intensity profile and adopting an intensity at the position as a second reference intensity;

processing of obtaining an aberration coefficient by fitting a first aberration function to an isointensity line that connects positions where intensity is equal to the first reference intensity in the first auto-correlation function and by fitting a second aberration function to an isointensity line that connects positions where intensity is equal to the second reference intensity in the second auto-correlation function; and processing of controlling the electron optical system based on the aberration coefficient.

With such a scanning transmission electron microscope, since the reference intensity for drawing an isointensity line is an intensity at a position of an inflection point that is closest to a center of an auto-correlation function in an intensity profile, an aberration coefficient can be accurately obtained regardless of a structure of a specimen. Therefore, with such a scanning transmission electron microscope, an aberration of an electron optical system can be accurately corrected regardless of a structure of a specimen.

(2) According to an embodiment of the invention, there is provided a scanning transmission electron microscope including:

an electron optical system that includes an aberration corrector; and a control unit that controls the aberration corrector, the control unit performing:

processing of acquiring a first scanning transmission electron microscope image and a second scanning transmission electron microscope image photographed at mutually different defocus amounts;

processing of calculating a first auto-correlation function that is an auto-correlation function of the first scanning transmission electron microscope image;

processing of calculating a second auto-correlation function that is an auto-correlation function of the second scanning transmission electron microscope image;

processing of obtaining a defocus amount based on a contrast of the first auto-correlation function and a contrast of the second auto-correlation function; and processing of controlling the electron optical system based on the obtained defocus amount.

With such a scanning transmission electron microscope, an effect of noise of a scanning transmission electron microscope image can be reduced and a defocus amount can be accurately obtained. Therefore, with such a scanning transmission electron microscope, an aberration of an electron optical system can be accurately corrected.

(3) According to an embodiment of the invention, there is provided an aberration correction method of a scanning transmission electron microscope having an electron optical system that includes an aberration corrector, the aberration correction method including:

acquiring a first scanning transmission electron microscope image and a second scanning transmission electron microscope image photographed at mutually different defocus amounts;

calculating a first auto-correlation function that is an auto-correlation function of the first scanning transmission electron microscope image;

acquiring a first intensity profile along a straight line that passes through a center of the first auto-correlation function;

obtaining a position of an inflection point that is closest to the center of the first auto-correlation function in the first intensity profile and adopting an intensity at the position as a first reference intensity;

fitting a first aberration function to an isointensity line that connects positions where intensity is equal to the first reference intensity in the first auto-correlation function;

calculating a second auto-correlation function that is an auto-correlation function of the second scanning transmission electron microscope image;

acquiring a second intensity profile along a straight line that passes through a center of the second auto-correlation function;

obtaining a position of an inflection point that is closest to the center of the second auto-correlation function in the second intensity profile and adopting an intensity at the position as a second reference intensity;

fitting a second aberration function to an isointensity line that connects positions where intensity is equal to the second reference intensity in the second auto-correlation function; and controlling the electron optical system based on an aberration coefficient obtained by the fitting of the first aberration function and the fitting of the second aberration function.

With such an aberration correction method, since the reference intensity for drawing an isointensity line is an intensity at a position of an inflection point that is closest to a center of an auto-correlation function in an intensity profile, an aberration coefficient can be accurately obtained regardless of a structure of a specimen. Therefore, with such an aberration correction method, an aberration of an electron optical system can be accurately corrected regardless of a structure of a specimen.

(4) According to an embodiment of the invention, there is provided an aberration correction method of a scanning transmission electron microscope having an electron optical system that includes an aberration corrector, the aberration correction method including:

acquiring a first scanning transmission electron microscope image and a second scanning transmission electron microscope image photographed at mutually different defocus amounts;

calculating a first auto-correlation function that is an auto-correlation function of the first scanning transmission electron microscope image;

calculating a second auto-correlation function that is an auto-correlation function of the second scanning transmission electron microscope image;

obtaining a defocus amount based on a contrast of the first auto-correlation function and a contrast of the second auto-correlation function; and controlling the electron optical system based on the obtained defocus amount.

With such an aberration correction method, an effect of noise of a scanning transmission electron microscope image can be reduced and a defocus amount can be accurately obtained. Therefore, with such an aberration correction method, an aberration of an electron optical system can be accurately corrected.

Embodiments of the invention are described in detail below with reference to the drawings. Note that the following embodiments do not unduly limit the scope of the invention as stated in the claims. In addition, all of the elements described below are not necessarily essential requirements of the invention.

1. Configuration of Electron Microscope

First, a scanning transmission electron microscope according to an embodiment of the invention will be described with reference to the drawings. FIG. 1 is a diagram illustrating a configuration of a scanning transmission electron microscope 100 according to the embodiment of the invention.

The scanning transmission electron microscope 100 is a scanning transmission electron microscope (STEM) provided with an electron optical system that includes an aberration corrector 30. The scanning transmission electron microscope 100 is capable of scanning a surface of a specimen 2 with an electron probe and detecting electrons transmitted through the specimen 2 to obtain a scanning transmission electron microscope image (hereinafter, also referred to as a "STEM image").

As illustrated in FIG. 1, the scanning transmission electron microscope 100 includes an electron source 10, a condenser lens 12, a scanning coil 13, an objective lens 14, an intermediate lens 18, a projector lens 20, the aberration corrector 30, a specimen stage 16, a specimen holder 17, STEM detectors 22a and 22b, a control unit 40, an operation unit 50, a display unit 52, and a storage unit 54. The electron optical system of the scanning transmission electron microscope 100 includes the condenser lens 12, the scanning coil 13, the objective lens 14, the intermediate lens 18, the projector lens 20, and the aberration corrector 30.

The electron source 10 generates electrons. The electron source 10 is, for example, an electron gun which accelerates electrons emitted from a cathode by an anode and which emits an electron beam.

The condenser lens 12 focuses the electron beam emitted from the electron source 10. Although not illustrated, the condenser lens 12 may be constituted by a plurality of electron lenses. The condenser lens 12 and the objective lens 14 constitute an illumination system of the scanning transmission electron microscope 100. An electron probe can be formed by focusing an electron beam with the illumination system.

The scanning coil 13 is a coil for deflecting an electron beam and scanning a surface of the specimen 2 with an electron beam (an electron probe) focused by the condenser lens 12 and the objective lens 14. The scanning coil 13 deflects the electron probe based on a scanning signal generated by a scanning signal generator (not illustrated) of the scanning transmission electron microscope 100. As a result, the surface of the specimen 2 can be scanned with the electron probe.

The objective lens 14 is a lens for focusing an electron beam on a surface of the specimen 2 to form an electron probe. In addition, the objective lens 14 forms an image with electrons transmitted through the specimen 2.

The specimen stage 16 supports the specimen 2 held by the specimen holder 17. The specimen 2 can be positioned using the specimen stage 16.

The intermediate lens 18 and the projector lens 20 guide electrons transmitted through the specimen 2 to the STEM detectors 22a and 22b. The objective lens 14, the intermediate lens 18, and the projector lens 20 constitute an imaging system of the scanning transmission electron microscope 100.

A bright-field STEM detector 22a detects, among electrons transmitted through the specimen 2, electrons transmitted without being scattered by the specimen 2 as well as electrons scattered by the specimen 2 at angles equal to or smaller than a predetermined angle. The bright-field STEM detector 22a is arranged on an optical axis.

A dark-field STEM detector 22b detects electrons scattered at a specific angle by the specimen 2. The dark-field STEM detector 22b is an annular detector.

It should be noted that a detector for obtaining a STEM image is not particularly limited as long as a STEM image can be obtained and, for example, a multi-segment detector of which a detector plane is divided into a plurality of regions or a pixelated detector using a charge coupled device (CCD) image sensor may be used.

The aberration corrector 30 is built into the illumination system of the scanning transmission electron microscope 100. In the illustrated example, the aberration corrector 30 is disposed in a subsequent stage to the condenser lens 12. The aberration corrector 30 corrects an aberration of the illumination system of the scanning transmission electron microscope 100. The aberration corrector 30 corrects a two-fold astigmatism that occurs in the illumination system. The aberration corrector 30 includes a multipole element that generates an electric field, a magnetic field, or a superimposed field thereof. An aberration correction power source controller 31 operates the aberration corrector 30.

In the scanning transmission electron microscope 100, an electron beam discharged from the electron source 10 is focused by the condenser lens 12 and the objective lens 14 (the illumination system) to form an electron probe and illuminates the specimen 2. An aberration of the illumination system is corrected by the aberration corrector 30. An electron beam illuminating the specimen 2 is caused to scan a surface of the specimen 2 by the scanning coil 13. An electron beam transmitted through the specimen 2 is guided by the objective lens 14, the intermediate lens 18, and the projector lens 20 to the STEM detectors 22a and 22b to be detected by the STEM detectors 22a and 22b. The STEM detectors 22a and 22b respectively send an intensity signal (a detection signal) of detected electrons to a signal processing unit (not illustrated). The signal processing unit images the intensity signal (the detection signal) of the electrons detected by the STEM detectors 22a and 22b in synchronization with the scanning signal. Accordingly, a bright-field STEM image and a dark-field STEM image can be obtained.

The operation unit 50 performs processing of acquiring an operation signal that corresponds to an operation performed by a user and sending the operation signal to the control unit 40. For example, functions of the operation unit 50 can be implemented by a button, a key, a touch panel display, or a microphone.

The display unit 52 displays an image generated by the control unit 40 and a function thereof can be realized by a display such as a liquid crystal display (LCD).

The storage unit 54 stores programs, data, and the like that cause or allow the control unit 40 to perform various calculation processing and control processing. In addition, the storage unit 54 is also used as a work area for the control unit 40, and temporarily stores results of calculations and the like performed by the control unit 40 in accordance with various programs. Functions of the storage unit 54 can be realized by a random access memory (RAM), a hard disk, or the like.

The control unit 40 performs processing of controlling the aberration corrector 30. The processing by the control unit 40 will be described later. Functions of the control unit 40 can be realized by having various processors (a central processing unit (CPU) and the like) execute programs.

2. Principle

Next, a principle of aberration correction will be described. While aberration correction using a dark-field STEM image will be described below, a bright-field STEM image may be used instead.

Generally, a dark-field STEM image I is a convolution of a specimen function S of the specimen 2 and a probe function P representing an intensity distribution of an electron beam (hereinafter, also referred to as a "probe") on the surface of the specimen 2. The dark-field STEM image I is represented by expression (1) below, where "*" denotes a convolution operator.

$$I = S * P \quad (1)$$

Therefore, an auto-correlation function $R_{ac}$ of the dark-field STEM image I is represented by expression (2) below.

$$R_{ac} = F^{-1}[F[I]^2] = F^{-1}[F[S*P]^2] = F^{-1}[F[S]^2 \cdot F[P]^2] \quad (2)$$

In expression (2), F denotes an operator representing a Fourier transform and $F^{-1}$ denotes an operator representing an inverse Fourier transform.

When the specimen function is represented by a delta function as in the case of an atomic potential (an atomic column potential), since the Fourier transform of a delta function is 1, expression (2) is represented by expression (3) below.

$$R_{ac} = F^{-1}[F[S]^2 \cdot F[P]^2] = F^{-1}[1^2 \cdot F[P]^2] = F^{-1}[F[P]^2] \quad (3)$$

Therefore, it is shown that the auto-correlation function R of the dark-field STEM image I is dependent on the probe function P.

In addition, assuming that the probe function when a two-fold astigmatism or a defocus occurs is a Gaussian function, when a proportionality coefficient is denoted by k, expression (3) is represented by expression (4) below.

$$R_{ac} = kP^2 \quad (4)$$

In other words, when a dark-field STEM image is being observed in a state where atomic resolution is obtained, the auto-correlation function $R_{ac}$ obtained based on the expression given above is proportional to an intensity of the probe.

On the other hand, when the probe function P includes two types of aberrations or, in other words, when the probe function P includes a defocus and a two-fold astigmatism, an isointensity line (a contour line) in an auto-correlation function of a dark-field STEM image obtained at a given focus is represented by an aberration function having expression (5) below as a coordinate value on plane coordinates representing the auto-correlation function.

$$P_x = k \cdot o_2 \cdot \cos(\theta) + k \cdot a_2 \cdot \cos(\theta - 2\theta_{a2})$$

$$P_y = k \cdot o_2 \cdot \sin(\theta) - k \cdot a_2 \cdot \sin(\theta - 2\theta_{a2}) \quad (5)$$

In this case, $P_x$ represents a displacement of the probe in an x-axis direction due to the aberration and, in a similar manner, $P_y$ represents a displacement of the probe in a y-axis direction. In addition, $o_2$ denotes an aberration coefficient representing a defocus that appears in the electron optical system, $a_2$ denotes a two-fold astigmatism coefficient, and $\theta_{a2}$ denotes a two-fold astigmatism azimuth.

Furthermore, an isointensity line (a contour line) in the auto-correlation function $R_{ac}$ obtained at a different focus is represented by an aberration function having expression (6) below as a coordinate value on plane coordinates representing the auto-correlation function.

$$P_x = k \cdot (o_2 + do_2) \cdot \cos(\theta) + k \cdot a_2 \cdot \cos(\theta - 2\theta_{a2}) \quad (6)$$

$$P_y = k \cdot (o_2 + do_2) \cdot \sin(\theta) - k \cdot a_2 \cdot \sin(\theta - 2\theta_{a2})$$

In expression (6), $d_{o2}$ represents a difference in defocus that occurs between the two focuses described above.

Therefore, by respectively fitting aberration functions based on expression (5) and expression (6) to the auto-correlation functions of the two dark-field STEM images obtained at two different focuses, the aberration coefficient $o_2$, the aberration coefficient $a_2$, and the proportionality coefficient k are immediately obtained.

When calculating an aberration from an auto-correlation function of a STEM image, one must assume that the auto-correlation function constitutes an auto-correlation function of a probe image. However, since the STEM image also includes information on a specimen structure, depending on the specimen observed, a variation occurs in a calculation result of an aberration.

Figure 2:
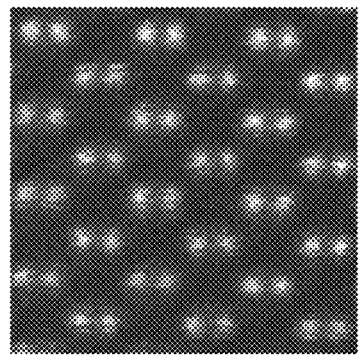
FIG. 2 illustrates a STEM image of Si [110].
Figure 3:
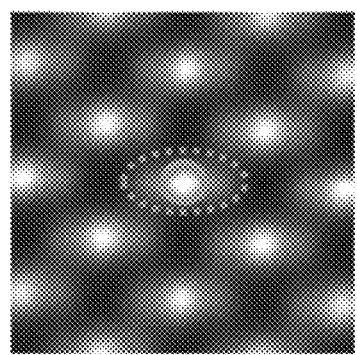
FIG. 3 illustrates an auto-correlation function of a STEM image.

FIG. 2 illustrates a STEM image of Si [110]. FIG. 3 illustrates an auto-correlation function of the STEM image illustrated in FIG. 2. As illustrated in FIG. 2, in Si [110], a dumbbell structure is observed in which two atoms are arranged side by side. Therefore, when an aberration function is fitted to an isointensity line in the auto-correlation function, even in a state where an aberration is sufficiently corrected, a result where a two-fold astigmatism remains in a lateral direction may be obtained as indicated by a dash line in FIG. 3. For this reason, the two-fold astigmatism cannot be accurately measured.

In consideration thereof, in the present embodiment, an aberration calculation (fitting of an aberration function) is performed in a portion that can be approximated to a probe function in an auto-correlation function. Specifically, an aberration calculation is performed in an auto-correlation function portion that corresponds to a single atomic image. Hereinafter, a method according to the present embodiment will be described.

Figure 4:
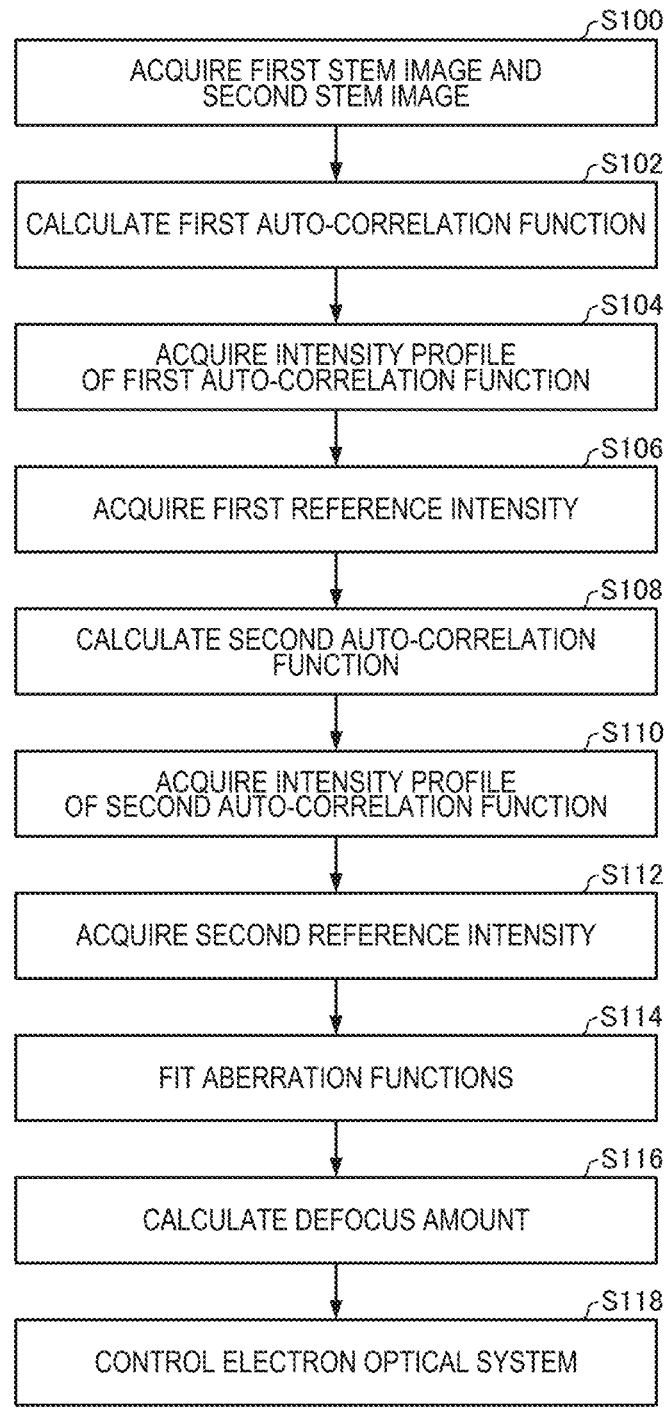
FIG. 4 is a flowchart illustrating an example of an aberration correction method according to an embodiment of the invention.

FIG. 4 is a flowchart illustrating an example of an aberration correction method according to the embodiment of the invention.

(1) Acquisition of Two STEM Images Photographed at Mutually Different Defocus Amounts (S100)

First, a first STEM image and a second STEM image photographed at mutually different defocus amounts are acquired. A defocus amount is changed by adjusting a lens such as the objective lens 14. The first STEM image and the second STEM image can be photographed by photographing two STEM images while changing excitation of the objective lens 14. Alternatively, the defocus amount may be changed by changing accelerating voltage. The first STEM image and the second STEM image may be dark-field STEM images or bright-field STEM images.

While a case where aberration correction is performed using two STEM images will be described herein, aberration correction may be performed using three or more STEM images.

(2) Calculation of Auto-Correlation Function of First STEM Image (S102)

An auto-correlation function of the first STEM image (hereinafter, also referred to as a "first auto-correlation function") is calculated. The first auto-correlation function can be calculated using expression (2) given above.

(3) Acquisition of Intensity Profile of First Auto-Correlation Function (S104)

Figure 5:
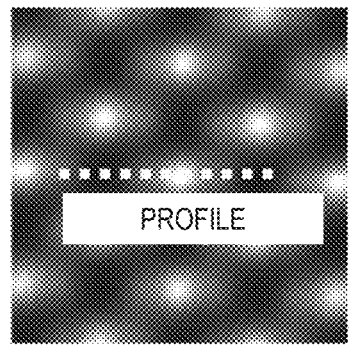
FIG. 5 is a diagram for illustrating a method of acquiring an intensity profile of an auto-correlation function.
Figure 6:
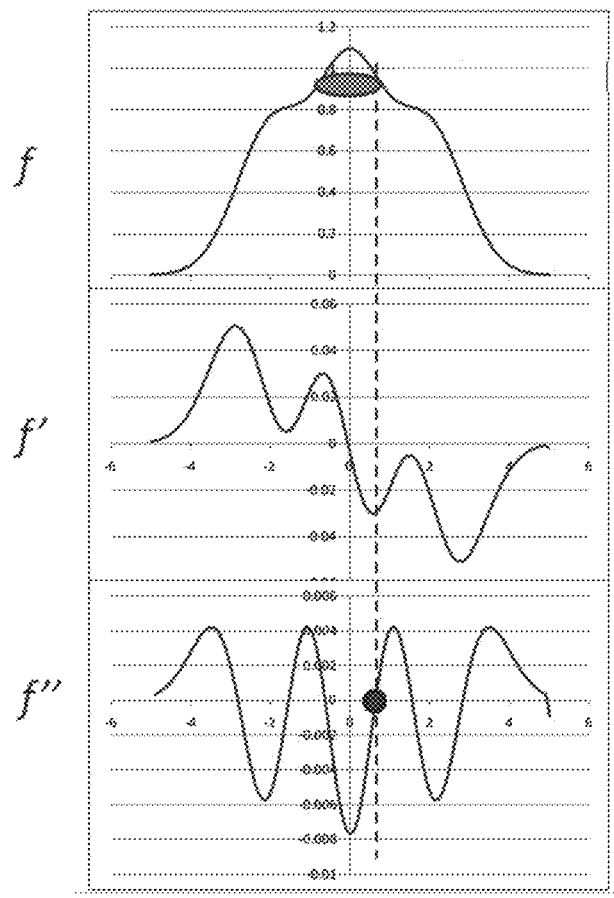
FIG. 6 is a diagram for illustrating an intensity profile of an auto-correlation function of a first STEM image.

FIG. 5 is a diagram for illustrating a method of acquiring an intensity profile of an auto-correlation function. In FIG. 5, a straight line that passes through a center of an auto-correlation function is depicted by a dash line. FIG. 6 is a diagram for illustrating the intensity profile of the auto-correlation function of the first STEM image. In the intensity profile illustrated in FIG. 6, an abscissa represents a position on the auto-correlation function and an ordinate represents intensity.

The intensity profile of the first auto-correlation function (hereinafter, also referred to as a "first intensity profile") is acquired. The first intensity profile is acquired along a straight line that passes through a center of the first auto-correlation function. As a result, a first intensity profile f illustrated in FIG. 6 is obtained.

(4) Calculation of First Reference Intensity (S106)

Next, in the first intensity profile f, a position of an inflection point that is closest to the center of the first auto-correlation function is obtained and an intensity at the position is adopted as a first reference intensity. For example, as illustrated in FIG. 6, the inflection point is identified using a second derivative f" of the first intensity profile f. Positions where the second derivative f" of the first intensity profile f is zero are positions of inflection points. Next, a position of an inflection point that is closest to the center of the first auto-correlation function is identified among the inflection points. In the first intensity profile f illustrated in FIG. 6, the position of the center of the first auto-correlation function is a position where the abscissa is zero. Next, an intensity of the first auto-correlation function at the position of the inflection point that is closest to the center of the first auto-correlation function is adopted as the first reference intensity. In this manner, the first reference intensity can be obtained.

While the position of the inflection point is identified using the second derivative f" in this case, alternatively, the position of the inflection point may be identified using a first derivative f'. A position of a minimal value or a maximal value of the first derivative f' is the position of the inflection point.

While a case where the first reference intensity is obtained from one first intensity profile has been described above, the first reference intensity may be obtained from a plurality of first intensity profiles. Specifically, first, the first intensity profile along a straight line that passes through the center of the first auto-correlation function is acquired in plurality while changing directions. Next, in each of the plurality of the first intensity profiles, a position of an inflection point that is closest to the center of the first auto-correlation function is obtained and an intensity at the position is obtained. A maximum value among the intensities obtained for the respective first intensity profiles in this manner is adopted as the first reference intensity.

(5) Calculation of Auto-Correlation Function of Second STEM Image (S108)

An auto-correlation function of the second STEM image is calculated. The auto-correlation function of the second STEM image can be calculated using expression (2) given above in a similar manner to calculating the auto-correlation function of the first STEM image.

(6) Acquisition of Intensity Profile of Auto-Correlation Function of Second STEM Image (S110)

An intensity profile of the auto-correlation function of the second STEM image (hereinafter, also referred to as a "second intensity profile") is acquired. The second intensity profile is acquired along a straight line that passes through a center of the auto-correlation function of the second STEM image.

(7) Calculation of Second Reference Intensity (S112)

Next, in the second intensity profile, a position of an inflection point that is closest to the center of the second auto-correlation function is obtained and an intensity at the position is adopted as a second reference intensity. A calculation method of the second reference intensity is similar to the calculation method of the first reference intensity described earlier.

(8) Fitting of Aberration Functions (S114)

Next, a first aberration function is fitted to an isointensity line that connects positions where intensity is equal to the first reference intensity in the first auto-correlation function, and a second aberration function is fitted to an isointensity line that connects positions where intensity is equal to the second reference intensity in the second auto-correlation function.

Specifically, in the first auto-correlation function, an isointensity line is drawn by connecting positions where intensity is equal to the first reference intensity, and an aberration function represented by expression (5) is fitted to the isointensity line using a least-squares method. In a similar manner, in the second auto-correlation function, an isointensity line is drawn by connecting positions where intensity is equal to the second reference intensity, and an aberration function represented by expression (6) is fitted to the isointensity line using a least-squares method. Accordingly, the aberration coefficient $o_2$, the aberration coefficient $a_2$, and the proportionality coefficient k can be obtained. Based on the aberration coefficient $o_2$, the aberration coefficient $a_2$, and the proportionality coefficient k, a defocus and a two-fold astigmatism can be obtained.

A solid line in FIG. 3 depicts a result of fitting an aberration function to an isointensity line that connects positions where intensity is equal to a reference intensity. By fitting the aberration function to the isointensity line that connects positions where intensity is equal to the reference intensity, as indicated by the solid line in FIG. 3, the aberration function can be fitted to an auto-correlation function portion that corresponds to a single atomic image.

(9) Calculation of Defocus Based on Contrast of Auto-Correlation Function (S116)

As described above, a defocus and a two-fold astigmatism are obtained by fitting an aberration function to an isointensity line that connects positions where intensity is equal to the reference intensity. However, since an intensity at a position of an inflection point that is closest to the center of the second auto-correlation function is adopted as an intensity of the isointensity line to which the aberration function is fitted, a size of a fitted ellipse (the aberration coefficient $o_2$) is no longer necessarily dependent on the defocus.

Therefore, in the present embodiment, a defocus is obtained based on a contrast of an auto-correlation function.

First, a contrast of the first auto-correlation function is obtained. Specifically, the contrast of the first auto-correlation function is obtained based on a difference between a minimum value of the first auto-correlation function and a maximum value of the first auto-correlation function in a region excluding a peak at the center of the first auto-correlation function.

Figure 7:
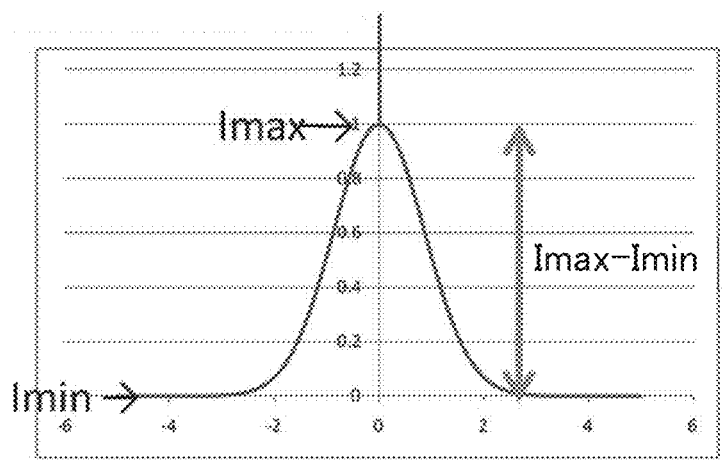
FIG. 7 is a diagram for illustrating a method of obtaining a contrast of an auto-correlation function.

FIG. 7 is a diagram for illustrating a method of obtaining a contrast of an auto-correlation function. The graph illustrated in FIG. 7 represents an example of an intensity profile that passes through a center of an auto-correlation function.

As illustrated in FIG. 7, the intensity profile of an auto-correlation function inevitably assumes a maximum value at a position of the center of the auto-correlation function. However, since the intensity at the position of the center of the auto-correlation function is uniquely determined by a sum of average intensities of original STEM images, the intensity at the position of the center of the auto-correlation function is not suitable for use when determining a contrast. Therefore, as illustrated in FIG. 7, a contrast is obtained based on a difference Imax−Imin between a minimum value Imin of the auto-correlation function and a maximum value Imax of the auto-correlation function in a region excluding a peak at the center of the auto-correlation function. For example, the difference Imax−Imin is adopted as the contrast of the auto-correlation function.

Next, a contrast of the second auto-correlation function is obtained. Specifically, in a similar manner to the contrast of the first auto-correlation function, the contrast of the second auto-correlation function is obtained based on a difference between a minimum value of the second auto-correlation function and a maximum value of the second auto-correlation function in a region excluding a peak at the center of the second auto-correlation function.

In this case, the contrast of an auto-correlation function of a STEM image assumes a maximum value in a STEM image in a focused state or, in other words, a STEM image of which a defocus amount is zero. A defocus amount is calculated using this characteristic. Hereinafter, processing of correcting defocus will be described on the assumption that a first STEM image has photographed at underfocus and a second STEM image has photographed at overfocus.

When a contrast of the first auto-correlation function is denoted by Cu, a contrast of the second auto-correlation function is denoted by Co, and a difference between a defocus amount of the first STEM image and a defocus amount of the second STEM image is denoted by Df, a defocus amount is obtained using the following expression.

$$a \times Df \times \{(Cu-Co)/|Cu-Co|\} \times \{|Cu-Co|/|Cu+Co|\}^b,$$

where a and b are arbitrary coefficients that are changeable in accordance with the situation. For example, a defocus amount can be obtained by setting a=b=1.

It should be noted that the expression for obtaining a defocus amount is not limited to the expression given above. For example, the following expression may be used.

$$2Df/(1+\exp[-a(Cu-Co)/(Cu+Co)])-1/2$$

As long as a unique value can be obtained using the contrast Cu of the first auto-correlation function and the contrast Co of the second auto-correlation function, the defocus amount may be calculated using expressions other than the above.

Alternatively, a defocus amount can be obtained from contrasts of auto-correlation functions of a plurality of STEM images photographed at underfocus using an expression that similarly has the contrasts as variables. In addition, a defocus amount can be obtained from contrasts of auto-correlation functions of a plurality of STEM images photographed at overfocus using an expression that similarly has the contrasts as variables.

(10) Control of Electron Optical System Based on Obtained Aberration Coefficient (S118)

The electron optical system is controlled based on the obtained aberration coefficient. Specifically, a two-fold astigmatism of the electron optical system is corrected based on the two-fold astigmatism obtained in step S114. The correction of the two-fold astigmatism is performed using the aberration corrector 30. The correction of the two-fold astigmatism is performed by operating the aberration corrector 30 so as to cancel out the obtained two-fold astigmatism.

In addition, a defocus of the electron optical system (the objective lens 14) is corrected based on the defocus amount obtained in step S116. The correction of the defocus is performed using the objective lens 14. The correction of the defocus is performed by operating the objective lens 14 so that an optimal defocus amount is attained based on a difference between the obtained defocus amount and the optimal defocus amount. Alternatively, the correction of the defocus may be performed by changing accelerating voltage.

Due to the steps described above, the aberration of the electron optical system can be corrected.

It should be noted that an order of the steps illustrated in FIG. 4 can be interchanged as long as the aberration can be corrected.

In addition, while a case where one auto-correlation function is acquired from one STEM image in step S102 has been described above, alternatively, a plurality of auto-correlation functions may be acquired from one STEM image. In this case, in step S114, an average of two-fold astigmatisms obtained from the plurality of auto-correlation functions may be adopted as the two-fold astigmatism to be used to perform the correction. Furthermore, in step S116, an average of defocus amounts obtained from the plurality of auto-correlation functions may be adopted as the defocus amount to be used to perform the correction.

3. Processes

Figure 8:
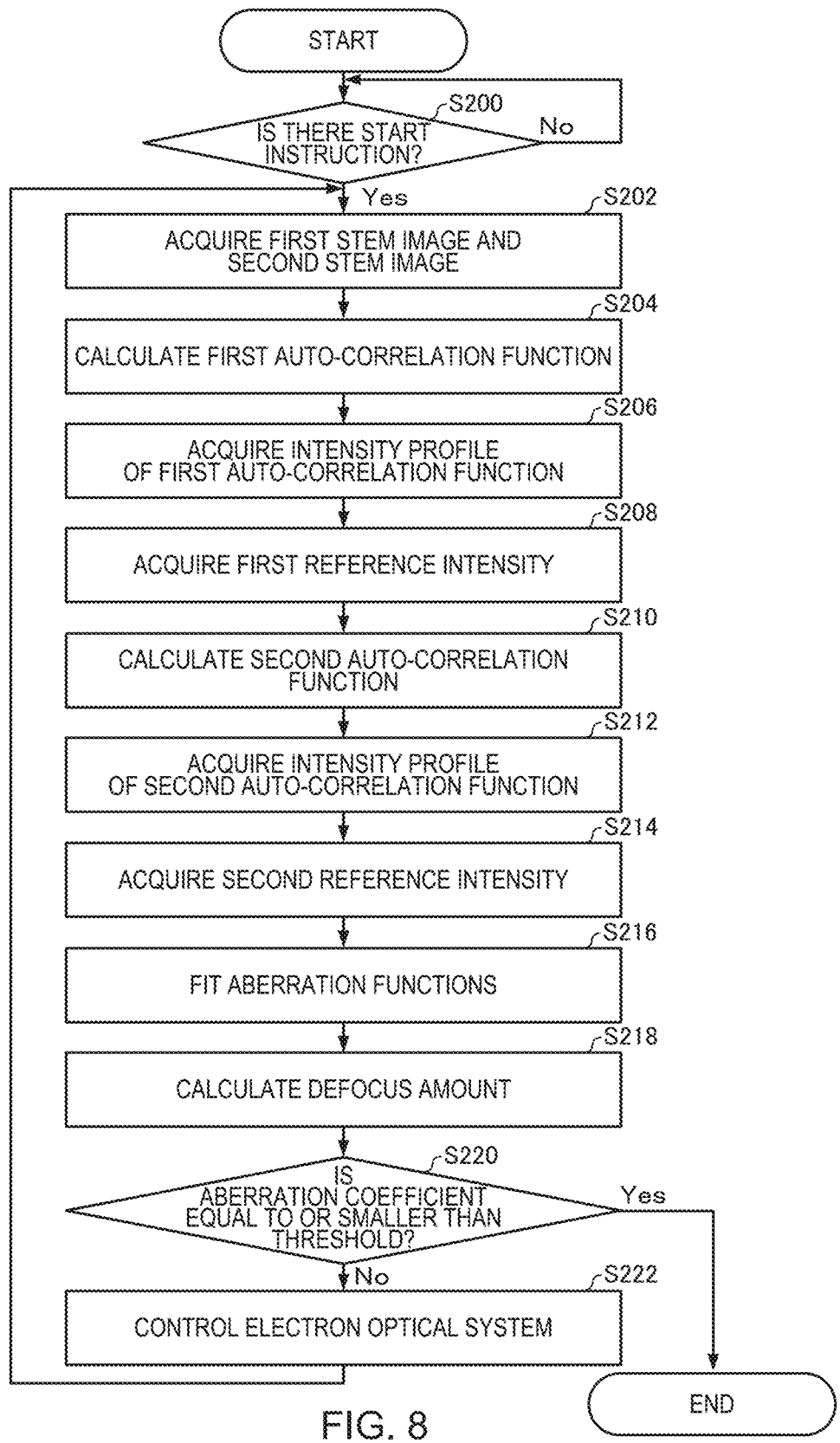
FIG. 8 is a flow chart illustrating an example of processing performed by a control unit.

Next, processing performed by the control unit 40 will be described. FIG. 8 is a flow chart illustrating an examples of processing performed by the control unit 40.

First, the control unit 40 determines whether or not a user has issued an instruction (a start instruction) to start correction of an aberration (S200), and stands by until a start instruction is issued (No in S200). For example, the control unit 40 determines that the user has issued a start instruction when the start instruction is input to the operation unit 50.

When the control unit 40 determines that a start instruction has been issued (Yes in S200), the control unit 40 acquires a first STEM image and a second STEM image with mutually different defocus amounts (S202).

For example, first, the control unit 40 adjusts the electron optical system to a focus value set in advance and acquires image data from a signal processing unit (not illustrated). Accordingly, the control unit 40 can acquire the first STEM image. Next, the control unit 40 adjusts the electron optical system to a focus value that differs from the focus value used when photographing the first STEM image, and acquires image data from the signal processing unit. Accordingly, the control unit 40 can acquire the second STEM image.

Next, the control unit 40 calculates a first auto-correlation function that is an auto-correlation function of the first STEM image (S204). The control unit 40 acquires an intensity profile (a first intensity profile) along a straight line that passes through a center of the calculated first auto-correlation function (S206). The control unit 40 obtains a position of an inflection point that is closest to the center of the first auto-correlation function in the acquired first intensity profile, and adopts an intensity at the position as a first reference intensity (S208). The position of the inflection point is calculated using a second derivative of the first intensity profile.

Next, the control unit 40 calculates a second auto-correlation function that is an auto-correlation function of the second STEM image (S210). The control unit 40 acquires an intensity profile (a second intensity profile) along a straight line that passes through a center of the calculated second auto-correlation function (S212). The control unit 40 obtains a position of an inflection point that is closest to the center of the second auto-correlation function in the acquired second intensity profile, and adopts an intensity at the position as a second reference intensity (S214).

Next, the control unit 40 obtains an aberration coefficient by fitting a first aberration function (refer to expression (5)) to an isointensity line that connects positions where intensity is equal to the first reference intensity in the first auto-correlation function and by fitting a second aberration function (refer to expression (6)) to an isointensity line that connects positions where intensity is equal to the second reference intensity in the second auto-correlation function (S216). A two-fold astigmatism can be obtained by the processing described above.

Next, the control unit 40 obtains a defocus amount based on a contrast of the first auto-correlation function and a contrast of the second auto-correlation function (S218). The control unit 40 obtains the contrast of the first auto-correlation function based on a difference between a minimum value of the first auto-correlation function and a maximum value of the first auto-correlation function in a region excluding a peak at the center of the first auto-correlation function. In addition, the control unit 40 obtains the contrast of the second auto-correlation function based on a difference between a minimum value of the second auto-correlation function and a maximum value of the second auto-correlation function in a region excluding a peak at the center of the second auto-correlation function. A defocus amount can be obtained by the processing described above.

Next, the control unit 40 determines whether or not the obtained aberration coefficient is equal to or smaller than a threshold (S220). The control unit 40 compares the obtained defocus amount with a defocus amount threshold and determines whether or not the defocus amount of the electron optical system is equal to or smaller than the threshold. In addition, the control unit 40 compares the obtained two-fold astigmatism with a two-fold astigmatism threshold and determines whether or not the two-fold astigmatism of the electron optical system is equal to or smaller than the threshold. Information on the defocus amount threshold and the two-fold astigmatism threshold can be arbitrarily set and the information is stored in the storage unit 54 in advance.

When both the defocus amount and the two-fold astigmatism are equal to or smaller than the thresholds, the control unit 40 determines that the aberration coefficient is equal to or smaller than the threshold. In other words, when at least one of the defocus amount and the two-fold astigmatism is not equal to or smaller than the thresholds, the control unit 40 determines that the aberration coefficient is not equal to or smaller than the threshold.

When it is determined that the aberration coefficient is not equal to or smaller than the threshold (No in S220), the control unit 40 controls the electron optical system based on the obtained aberration coefficient (S222). For example, the control unit 40 controls the aberration corrector 30 so that the obtained two-fold astigmatism is canceled out. In addition, the control unit 40 obtains an excitation amount of the objective lens 14 which enables an optimal focus to be attained based on the obtained defocus amount, and controls the objective lens 14.

After performing the processing of step S222, the control unit 40 returns to the processing of S202 and performs the processing of step S202 to step S220. The control unit 40 repeats the processing of step S202 to step S222 until the aberration coefficient is determined to be equal to or smaller than the threshold.

When it is determined that the aberration coefficient is equal to or smaller than the threshold (Yes in S220), the control unit 40 ends the processing of correcting an aberration.

4. Features

For example, the scanning transmission electron microscope 100 has the following features.

In the scanning transmission electron microscope 100, the control unit 40 obtains a position of an inflection point that is closest to a center of a first auto-correlation function in a first intensity profile and adopts an intensity at the position as a first reference intensity, and obtains a position of an inflection point that is closest to a center of a second auto-correlation function in a second intensity profile and adopts an intensity at the position as a second reference intensity. In addition, the control unit 40 obtains an aberration coefficient by fitting a first aberration function to an isointensity line that connects positions where intensity is equal to the first reference intensity in the first auto-correlation function and by fitting a second aberration function to an isointensity line that connects positions where intensity is equal to the second reference intensity in the second auto-correlation function.

As described above, in the scanning transmission electron microscope 100, since a reference intensity for drawing an isointensity line is an intensity at a position of an inflection point that is closest to a center of an auto-correlation function in an intensity profile, an aberration coefficient can be accurately obtained regardless of a structure of a specimen. Therefore, with the scanning transmission electron microscope 100, an aberration of an electron optical system can be accurately corrected regardless of a structure of a specimen.

In the scanning transmission electron microscope 100, the control unit 40 obtains the position of the inflection point that is closest to the center of the first auto-correlation function using a second derivative of the first intensity profile and obtains the position of the inflection point that is closest to the center of the second auto-correlation function using a second derivative of the second intensity profile.

Figure 9:
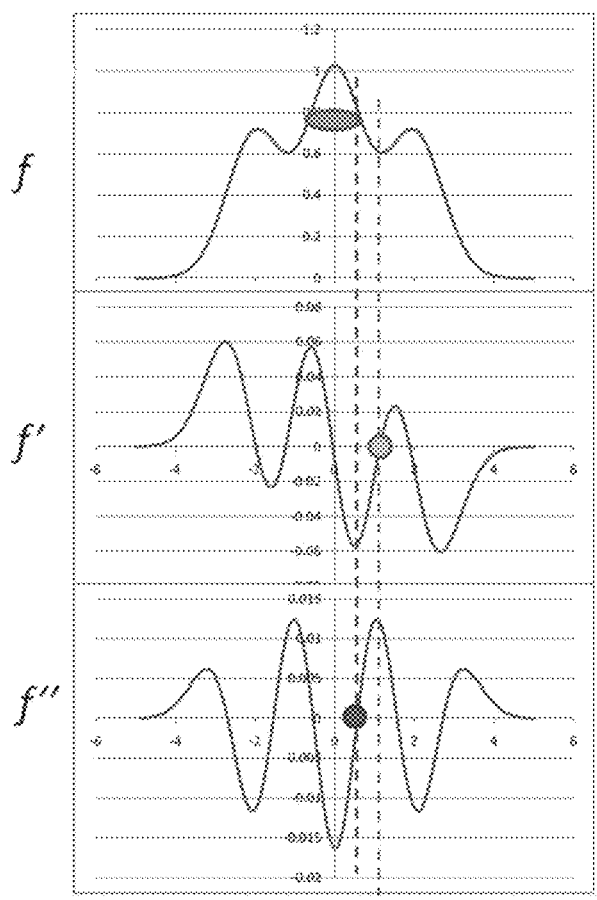
FIG. 9 is a diagram for illustrating an intensity profile of an auto-correlation function of a first STEM image.

In this case, while the control unit 40 adopts an intensity at a position of an inflection point (of which a second derivative is zero) which is closest to a center of an auto-correlation function in an intensity profile as a reference intensity for drawing an isointensity line, as illustrated in FIG. 9, an intensity at a position of a minimal value that is closest to the center of the auto-correlation function in the intensity profile may conceivably be adopted as the reference intensity. The position of the minimal value is a position where a first derivative is zero. However, as in the case illustrated in FIG. 6, there are cases where a minimal value is not present in an intensity profile. Therefore, versatility of this method is low.

As described above, in the scanning transmission electron microscope 100, since the reference intensity for drawing an isointensity line is an intensity at a position of an inflection point (of which a second derivative is zero) which is closest to a center of an auto-correlation function in an intensity profile, versatility of this method is high.

In the scanning transmission electron microscope 100, the control unit 40 obtains a defocus amount based on a contrast of the first auto-correlation function and a contrast of the second auto-correlation function. In addition, the control unit 40 obtains the contrast of the first auto-correlation function based on a difference between a minimum value of the first auto-correlation function and a maximum value of the first auto-correlation function in a region excluding a peak at the center of the first auto-correlation function. Furthermore, the control unit 40 obtains the contrast of the second auto-correlation function based on a difference between a minimum value of the second auto-correlation function and a maximum value of the second auto-correlation function in a region excluding a peak at the center of the second auto-correlation function. Therefore, in the scanning transmission electron microscope 100, an effect of noise of a STEM image can be reduced and a defocus amount can be accurately obtained.

As illustrated in FIG. 7, an auto-correlation function is divided into a peak at a center of the auto-correlation function and a peripheral pattern excluding the peak. A shape of the peripheral pattern excluding the peak is less likely to be affected by noise. Therefore, by obtaining a contrast of an auto-correlation function based on a difference between a minimum value of the auto-correlation function and a maximum value of the auto-correlation function in a region excluding the peak at the center of the auto-correlation function and obtaining a defocus amount based on the contrast, an effect of noise of a STEM image can be reduced and a defocus amount can be accurately obtained.

While a case where defocus is set to an optimal defocus based on the contrast of the first auto-correlation function and the contrast of the second auto-correlation function has been described above, for example, processing of acquiring a STEM image by changing focus and obtaining a contrast of an auto-correlation function of the acquired STEM image may be repeated to search for an optimal focus where the contrast of the auto-correlation function is highest. Accordingly, defocus can be corrected.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A scanning transmission electron microscope, comprising:
   an electron optical system that includes an aberration corrector; and
   a control unit that controls the aberration corrector,
   the control unit configured to:
   acquire a first scanning transmission electron microscope image and a second scanning transmission electron microscope image photographed at mutually different defocus amounts;
   calculate a first auto-correlation function that is an auto-correlation function of the first scanning transmission electron microscope image;
   acquire a first intensity profile along a straight line that passes through a center of the first auto-correlation function;
   obtain a position of an inflection point that is closest to the center of the first auto-correlation function in the first intensity profile and adopt an intensity at the position as a first reference intensity;
   calculate a second auto-correlation function that is an auto-correlation function of the second scanning transmission electron microscope image;
   acquire a second intensity profile along a straight line that passes through a center of the second auto-correlation function;
   obtain a position of an inflection point that is closest to the center of the second auto-correlation function in the second intensity profile and adopt an intensity at the position as a second reference intensity;
   obtain an aberration coefficient by fitting a first aberration function to an isointensity line that connects positions where intensity is equal to the first reference intensity in the first auto-correlation function and by fitting a second aberration function to an isointensity line that connects positions where intensity is equal to the second reference intensity in the second auto-correlation function; and
   control the electron optical system based on the aberration coefficient.

2. The scanning transmission electron microscope according to claim 1, wherein
   the aberration coefficient is a two-fold astigmatism.

3. The scanning transmission electron microscope according to claim 1, wherein
   in adopting the first reference intensity, the position of the inflection point that is closest to the center of the first auto-correlation function is obtained using a second derivative of the first intensity profile, and
   in adopting the second reference intensity, the position of the inflection point that is closest to the center of the second auto-correlation function is obtained using a second derivative of the second intensity profile.

4. The scanning transmission electron microscope according to claim 1, wherein
   the control unit is configured to: obtain a defocus amount based on a contrast of the first auto-correlation function and a contrast of the second auto-correlation function; and
   control the electron optical system based on the obtained defocus amount.

5. The scanning transmission electron microscope according to claim 4, wherein
   in obtaining the defocus amount,
   the contrast of the first auto-correlation function is obtained based on a difference between a minimum value of the first auto-correlation function and a maximum value of the first auto-correlation function in a region excluding a peak at the center of the first auto-correlation function, and
   the contrast of the second auto-correlation function is obtained based on a difference between a minimum value of the second auto-correlation function and a maximum value of the second auto-correlation function in a region excluding a peak at the center of the second auto-correlation function.

6. A scanning transmission electron microscope, comprising:
   an electron optical system that includes an aberration corrector; and
   a control unit that controls the aberration corrector,
   the control unit configured to:
   acquire a first scanning transmission electron microscope image and a second scanning transmission electron microscope image photographed at mutually different defocus amounts;
   calculate a first auto-correlation function that is an auto-correlation function of the first scanning transmission electron microscope image;
   calculate a second auto-correlation function that is an auto-correlation function of the second scanning transmission electron microscope image;
   obtain a defocus amount based on a contrast of the first auto-correlation function and a contrast of the second auto-correlation function; and
   control the electron optical system based on the obtained defocus amount.

7. The scanning transmission electron microscope according to claim 6, wherein
   in obtaining the defocus amount,
   the contrast of the first auto-correlation function is obtained based on a difference between a minimum value of the first auto-correlation function and a maximum value of the first auto-correlation function in a region excluding a peak at the center of the first auto-correlation function, and
   the contrast of the second auto-correlation function is obtained based on a difference between a minimum value of the second auto-correlation function and a maximum value of the second auto-correlation function in a region excluding a peak at the center of the second auto-correlation function.

8. An aberration correction method of a scanning transmission electron microscope having an electron optical system that includes an aberration corrector, the aberration correction method comprising:
   acquiring a first scanning transmission electron microscope image and a second scanning transmission electron microscope image photographed at mutually different defocus amounts;

calculating a first auto-correlation function that is an auto-correlation function of the first scanning transmission electron microscope image;

acquiring a first intensity profile along a straight line that passes through a center of the first auto-correlation function;

obtaining a position of an inflection point that is closest to the center of the first auto-correlation function in the first intensity profile and adopting an intensity at the position as a first reference intensity;

fitting a first aberration function to an isointensity line that connects positions where intensity is equal to the first reference intensity in the first auto-correlation function;

calculating a second auto-correlation function that is an auto-correlation function of the second scanning transmission electron microscope image;

acquiring a second intensity profile along a straight line that passes through a center of the second auto-correlation function;

obtaining a position of an inflection point that is closest to the center of the second auto-correlation function in the second intensity profile and adopting an intensity at the position as a second reference intensity;

fitting a second aberration function to an isointensity line that connects positions where intensity is equal to the second reference intensity in the second auto-correlation function; and controlling the electron optical system based on an aberration coefficient obtained by the fitting of the first aberration function and the fitting of the second aberration function.

9. An aberration correction method of a scanning transmission electron microscope having an electron optical system that includes an aberration corrector, the aberration correction method comprising:

acquiring a first scanning transmission electron microscope image and a second scanning transmission electron microscope image photographed at mutually different defocus amounts;

calculating a first auto-correlation function that is an auto-correlation function of the first scanning transmission electron microscope image;

calculating a second auto-correlation function that is an auto-correlation function of the second scanning transmission electron microscope image;

obtaining a defocus amount based on a contrast of the first auto-correlation function and a contrast of the second auto-correlation function; and controlling the electron optical system based on the obtained defocus amount.

* * * * *